United States Patent
Kim et al.

(10) Patent No.: US 12,165,932 B2
(45) Date of Patent: Dec. 10, 2024

(54) DISPLAY DEVICE

(71) Applicant: LG Display Co., Ltd., Seoul (KR)

(72) Inventors: Seeun Kim, Seoul (KR); JongSung Kim, Seoul (KR); HyunGon Kim, Seoul (KR); YoungIn Jang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 12 days.

(21) Appl. No.: 18/202,807

(22) Filed: May 26, 2023

(65) Prior Publication Data

US 2024/0222200 A1    Jul. 4, 2024

(30) Foreign Application Priority Data

Dec. 29, 2022    (KR) .................. 10-2022-0189106

(51) Int. Cl.
| | | |
|---|---|---|
| *G09G 3/00* | (2006.01) | |
| *G09G 3/20* | (2006.01) | |
| *G09G 3/32* | (2016.01) | |
| *H01L 21/66* | (2006.01) | |
| *H01L 23/00* | (2006.01) | |

(Continued)

(52) U.S. Cl.
CPC ........... *H01L 22/20* (2013.01); *G09G 3/2096* (2013.01); *G09G 3/32* (2013.01); *H01L 24/24* (2013.01); *H01L 25/167* (2013.01); *H01L 33/507* (2013.01); *G09G 2300/0452* (2013.01); *G09G 2320/0666* (2013.01); *H01L 2224/24051* (2013.01); *H01L 2224/24147* (2013.01); *H01L 2933/0041* (2013.01)

(58) Field of Classification Search
CPC ... G09G 2300/0413; G09G 2300/0452; G09G 2320/0666; G09G 2330/08; G09G 2330/10; G09G 3/006; G09G 3/2096; G09G 3/32; H01L 22/20; H01L 2224/24051; H01L 2224/24147; H01L 24/24; H01L 25/0753; H01L 25/167; H01L 27/153; H01L 2933/0041; H01L 33/44; H01L 33/507
See application file for complete search history.

(56) References Cited

U.S. PATENT DOCUMENTS

| | | | |
|---|---|---|---|
| 2019/0081109 A1* | 3/2019 | Zhang | .................... H10K 71/00 |
| 2021/0104574 A1 | 4/2021 | Behringer et al. | |
| 2021/0343230 A1 | 11/2021 | Wang et al. | |

(Continued)

FOREIGN PATENT DOCUMENTS

| | | |
|---|---|---|
| KR | 10-2009-0077909 A | 7/2009 |
| KR | 10-2021-0083681 A | 7/2021 |
| WO | WO 2020/208558 A1 | 10/2020 |

*Primary Examiner* — Insa Sadio
(74) *Attorney, Agent, or Firm* — Birch, Stewart, Kolasch & Birch, LLP

(57) ABSTRACT

A display device can include a substrate including a plurality of pixels; a plurality of light emitting diodes disposed in each of the plurality of pixels; a color conversion member disposed over at least two light emitting diodes among the plurality of light emitting diodes in one pixel among the plurality of pixels; and a light shielding pattern disposed over at least one light emitting diode among the plurality of light emitting diodes in the one pixel for forming a black sub pixel that does not emit light outside of the display device. Also, each of the plurality of pixels includes a first sub pixel, a second sub pixel, a third sub pixel, and one or more black sub pixels.

23 Claims, 10 Drawing Sheets

(51) Int. Cl.
*H01L 25/16* (2023.01)
*H01L 33/50* (2010.01)

(56) References Cited

U.S. PATENT DOCUMENTS

2021/0391510 A1    12/2021  Choi
2021/0408500 A1*   12/2021  Han ..................... H10K 71/00

* cited by examiner

DISPLAY DEVICE

CROSS-REFERENCE TO RELATED APPLICATIONS

This application claims the benefit and priority to Korean Patent Application No. 10-2022-0189106 filed in the Republic of Korea on Dec. 29, 2022, the entirety of which is expressly incorporated by reference for all purposes as if fully set forth herein.

BACKGROUND

Technical Field

The present disclosure relates to a display device, and more particularly to, for example, without limitation, a display device using a light emitting diode (LED).

Description of the Related Art

Among display devices, which are used for a monitor of a computer, a television, or a cellular phone, there are an organic light emitting display (OLED) device which is a self-emitting device and a liquid crystal display (LCD) device which requires a separate light source (e.g., a backlight unit).

An applicable range of the display device is diversified to personal digital assistants as well as monitors of computers and televisions, and a display device with a large display area and a reduced volume and weight is being studied.

Further, a display device including a light emitting diode (LED) is attracting attention as the next generation display device. Since the LED is formed of an inorganic material, rather than an organic material, reliability is excellent so that a lifespan is longer than that of the liquid crystal display device or the organic light emitting display device. Further, the LED has a fast lighting speed, excellent luminous efficiency, and a strong impact resistance so that stability is excellent and an image having a high luminance can be displayed.

However, when LEDs are transferred to a substrate, alignment and placement issues can occur, which can result in some defective sub pixels. This especially can be an issue when trying to transfer and position thousands and even millions of micro LEDs onto the substrate. Thus, there exists a need for an efficient process and configuration for forming sub pixels that can correct for any defective sub pixels that may occur while also minimizing the use of unnecessary redundant or backup sub pixels.

The description provided in the description of the related art section should not be assumed to be prior art merely because it is mentioned in or associated with the description of the related art section. The description of the related art section may include information that describes one or more aspects of the subject technology.

SUMMARY OF THE DISCLOSURE

An object to be achieved by the present disclosure is to provide a display device in which extra or backup sub pixels to be used for when there is a defective sub pixel can be reduced or minimized, and to provide for a more efficient manufacturing process and configuration.

Another object to be achieved by the present disclosure is to provide a display device in which a color conversion member and a black matrix are formed according to a position of a defective sub pixel.

Still another object to be achieved by the present disclosure is to provide a display device which can reduce a manufacturing cost by reducing a number of light emitting diodes that are used.

Still another object to be achieved by the present disclosure is to provide a display device in which a process of repairing a defective sub pixel can be eliminated or reduced by further transferring a light emitting diode to simplify the process.

Still another object to be achieved by the present disclosure is to provide a display device in which only a same type of light emitting diode is used, in order to increase a transferring yield (e.g., using only light emitting diodes of a same color, such as blue).

Objects of the present disclosure are not limited to the above-mentioned objects, and other objects, which are not mentioned above, can be clearly understood by those skilled in the art from the following descriptions.

According to an aspect of the present disclosure, a display device includes a substrate in which a plurality of pixels is defined; a plurality of light emitting diodes disposed in the plurality of pixels; a color conversion member disposed on some light emitting diodes among the plurality of light emitting diodes; and a light shielding pattern which is disposed on the remaining light emitting diode of the plurality of light emitting diodes, and each of the plurality of pixels includes one first sub pixel, one second sub pixel, one third sub pixel, and one or more black sub pixels. Accordingly, an extra sub pixel which will be replaced with the defective sub pixel is formed, and the black sub pixel is formed in consideration of the position of the defective sub pixel to simplify the repair process and the number of light emitting diodes can be reduced to save the manufacturing cost.

Other detailed matters of the example embodiments are included in the detailed description and the drawings.

According to the present disclosure, an extra sub pixel to be used instead of a defective sub pixel can be formed in reduction or minimum.

According to the present disclosure, the extra sub pixel is formed in reduction or minimum to reduce a number of light emitting diodes required for the entire display device.

According to the present disclosure, a color conversion member and a black matrix can be designed in accordance with the position of the defective sub pixel.

According to the present disclosure, a repair process of further transferring a light emitting diode can be eliminated to simplify the process.

According to the present disclosure, the number of transferring processes can be reduced, and only a single type of light emitting diode is used to optimize a process to increase a transferring yield of the light emitting diode.

According to the present disclosure, processes of manufacturing and repairing the display device can be simplified to reduce greenhouse gas emission and a production energy.

The effects according to the present disclosure are not limited to the contents exemplified above, and more various effects are included in the present disclosure.

Additional features and aspects of the disclosure are set forth in part in the description that follows and in part will become apparent from the description or can be learned by practice of the inventive concepts provided herein. Other features and aspects of the inventive concepts can be realized and attained by the structures pointed out in the present disclosure, or derivable therefrom, and the claims hereof as well as the appended drawings.

It is to be understood that both the foregoing general description and the following detailed description are explanatory examples and are intended to provide further explanation of the inventive concepts as claimed.

BRIEF DESCRIPTION OF THE DRAWINGS

The accompanying drawings provide a further understanding of the disclosure and can be incorporated in and constitute a part of the disclosure, illustrate embodiments of the disclosure and together with the description serve to explain various principles of the disclosure.

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
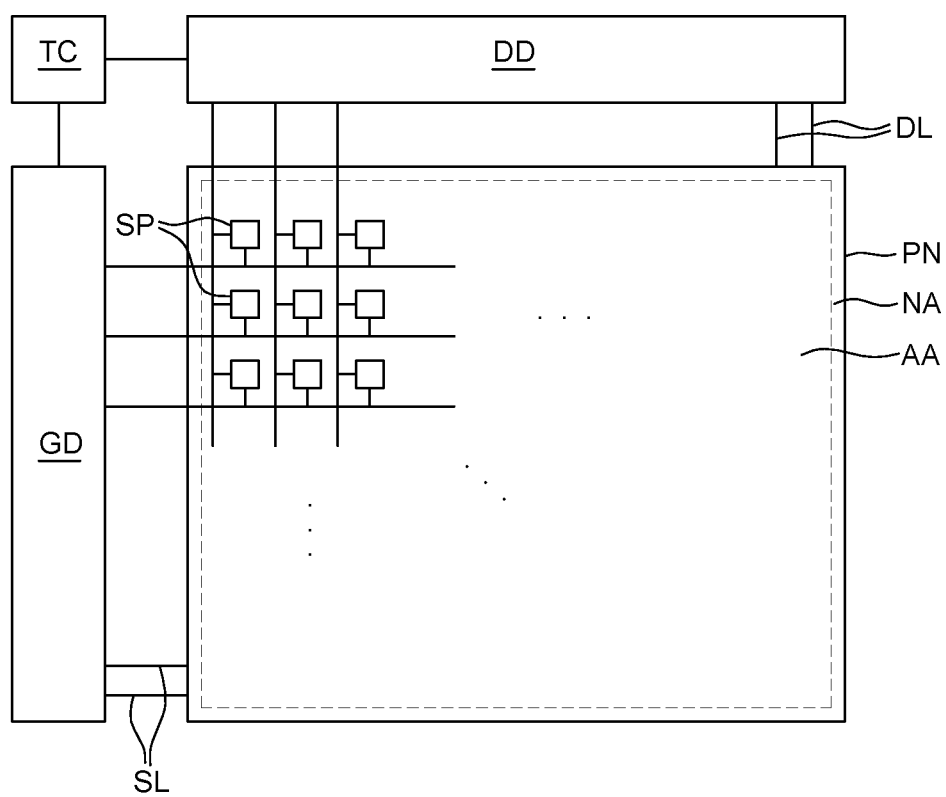
FIG. 1 is a schematic diagram of a display device according to an embodiment of the present disclosure.

Reference will now be made in detail to embodiments of the present disclosure, examples of which can be illustrated in the accompanying drawings. In the following description, when a detailed description of well-known functions or configurations related to this document is determined to unnecessarily cloud a gist of the inventive concept, the detailed description thereof will be omitted or can be briefly provided. The progression of processing steps and/or operations described is an example; however, the sequence of steps and/or operations is not limited to that set forth herein and can be changed as is known in the art, with the exception of steps and/or operations necessarily occurring in a particular order. Like reference numerals designate like elements throughout. Names of the respective elements used in the following explanations can be selected only for convenience of writing the specification and can be thus different from those used in actual products.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, areas, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted or can be briefly provided to avoid unnecessarily obscuring the subject matter of the present disclosure. The terms such as "including," "having," "contain," "constitute," "make up of," "formed of," and "consist of" used herein are generally intended to allow other components to be added unless the terms are used with the term "only." Any references to singular can include plural unless expressly stated otherwise.

Components are interpreted to include an ordinary error range or tolerance range even if there is no explicit description of such an error or tolerance range.

When the position relation between two parts is described using the terms such as "on," "over," "above," "below," "beside," "beneath," "near," "close to," "adjacent to," and "next," one or more parts can be positioned between the two parts unless the terms are used with the term "immediately," "closely" or "directly."

When temporally relative terms, such as "after," "subsequent," "following," "next" and "before" are used to define a temporal relationship, a non-continuous situation can be included unless a more limiting term, such as "just," "immediately" or "directly" is used.

When an element or layer is disposed "on" another element or layer, another layer or another element can be directly on the other element or interposed therebetween.

Although the terms "first," "second," and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawings are illustrated for convenience of description, and the present disclosure is not limited to the size and the thickness of the component illustrated.

The features of various embodiments of the present disclosure can be partially or entirely coupled to or combined with each other and can be interlocked and operated in technically various ways, and the embodiments can be carried out independently of or in association with each other.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" can apply, for example, to a separate circuit or structure, an integrated circuit, a computational block of a circuit device, or any structure configured to perform a described function as should be understood to one of ordinary skill in the art.

The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

The term "at least one" should be understood as including any and all combinations of one or more of the associated listed items. For example, the meaning of "at least one of a first item, a second item, and a third item" encompasses the combination of all three listed elements, combinations of any two of the three elements, as well as each individual element, the first element, the second element, and the third element.

Hereinafter, example embodiments of the present disclosure will be described in detail with reference to the accompanying drawings. For convenience of description, a scale of each of elements illustrated in the accompanying drawings differs from a real scale, and thus, is not limited to a scale illustrated in the drawings.

Hereinafter, a display device according to example embodiments of the present disclosure will be described in detail with reference to accompanying drawings.

FIG. 1 is a schematic diagram of a display device according to an example embodiment of the present disclosure. In FIG. 1, for the convenience of description, among various components of the display device 100, only a display panel PN, a gate driver GD, a data driver DD, and a timing controller TC are illustrated.

Referring to the example of FIG. 1, the display device 100 includes a display panel PN including a plurality of sub pixels SP, a gate driver GD and a data driver DD which supply various signals to the display panel PN, and a timing controller TC which controls the gate driver GD and the data driver DD.

The gate driver GD supplies a plurality of scan signals to a plurality of scan lines SL in accordance with a plurality of gate control signals supplied from the timing controller TC. Even though in FIG. 1, it is illustrated that one gate driver GD is disposed to be spaced apart from one side of the display panel PN, the number of the gate drivers GD and the placement thereof are not limited thereto.

The data driver DD converts image data input from the timing controller TC in accordance with a plurality of data control signals supplied from the timing controller TC into a data voltage using a reference gamma voltage. The data driver DD can supply the converted data voltage to the plurality of data lines DL.

The timing controller TC aligns image data input from the outside to supply the image data to the data driver DD. The timing controller TC can generate a gate control signal and a data control signal using synchronization signals input from the outside, such as a dot clock signal, a data enable signal, and horizontal/vertical synchronization signals. The timing controller TC supplies the generated gate control signal and data control signal to the gate driver GD and the data driver DD, respectively, to control the gate driver GD and the data driver DD.

The display panel PN is a configuration which displays images to the user and includes the plurality of sub pixels SP. In the display panel PN, the plurality of scan lines SL and the plurality of data lines DL intersect each other, and the plurality of sub pixels SP is connected to the scan line SL and the data line DL, respectively. In addition, each of the plurality of sub pixels SP can be connected to a high potential power line, a low potential power line, and a reference line.

In the display panel PN, an display area (or active area) AA and the non-display area (or non-active area) NA enclosing, surrounding or adjacent to the display area AA can be defined.

The display area AA is an area in which images are displayed in the display device 100. In the display area AA, a plurality of sub pixels SP which configures a plurality of pixels PX and a circuit for driving the plurality of sub pixels SP can be disposed. The plurality of sub pixels SP is a minimum unit which configures the display area AA and n sub pixels SP form one pixel PX. In each of the plurality of sub pixels SP, a light emitting diode 120 and a thin film transistor for driving the light emitting diode 120 can be disposed. The plurality of light emitting diodes 120 can be defined in different ways depending on the type of the display panel PN. For example, when the display panel PN is an inorganic light emitting display panel PN, the light emitting diode 120 can be a light emitting diode (LED) or a micro light emitting diode (LED).

In the display area AA, a plurality of signal lines which transmits various signals to the plurality of sub pixels SP is disposed. For example, the plurality of signal lines includes a plurality of data lines DL which supplies a data voltage to each of the plurality of sub pixels SP and a plurality of scan lines SL which supplies a gate voltage to each of the plurality of sub pixels SP. The plurality of scan lines SL extends from the display area AA in one direction to be connected to the plurality of sub pixels SP and the plurality of data lines DL extends from the display area AA in a direction different from the one direction to be connected to the plurality of sub pixels SP. In addition, in the display area AA, a low potential power line and a high potential power line can be further disposed, but it is not limited thereto.

The non-display area NA is an area where images are not displayed so that the non-display area NA can be defined as an area extending from the display area AA. In the non-display area NA, a link line which transmits a signal to the sub pixel SP of the display area AA, a pad electrode, or a driving IC such as a gate driver IC or a data driver IC are disposed.

In addition, the non-display area NA can be located on a rear surface of the display panel PN, that is, a surface on which the sub pixels SP are not disposed or can be omitted, and is not limited as illustrated in the drawing. The rear surface can be the surface of the display panel opposite to the surface which displays the image.

In addition, a driver such as a gate driver GD, a data driver DD, and a timing controller TC can be connected to the display panel PN in various ways. For example, the gate driver GD can be mounted in the non-display area NA in a gate in panel (GIP) manner or mounted between the plurality of sub pixels SP in the display area AA in a gate in active area (GIA) manner, the arrangement of the gate driver GD is not limited thereto. For example, the data driver DD and the timing controller TC are formed in separate flexible film and printed circuit board, and can be electrically connected to the display panel PN by bonding the flexible film and the printed circuit board to a pad electrode formed in the non-display area NA of the display panel PN. If the gate driver GD is mounted in the GIP manner and the data driver DD and the timing controller TC transmits a signal to the display panel PN through a pad electrode of the non-display area NA, an area of the non-display area NA to dispose the gate driver GD and the pad electrode needs to be ensured. By doing this, a bezel is increased.

In contrast, when the gate driver GD is mounted in the display area AA in the GIA manner and a side line SRL which connects the signal line on the front surface of the display panel PN to the pad electrode on a rear surface of the display panel PN is formed to bond the flexible film and the printed circuit board onto a rear surface of the display panel PN, the non-display area NA can be reduced or minimized on the front surface of the display panel PN. That is, when the gate driver GD, the data driver DD, and the timing controller TC are connected to the display panel PN as described above, a zero bezel in which there is no bezel can be substantially implemented, which will be described in more detail with reference to FIGS. 2A and 2B.

Figure 2A:
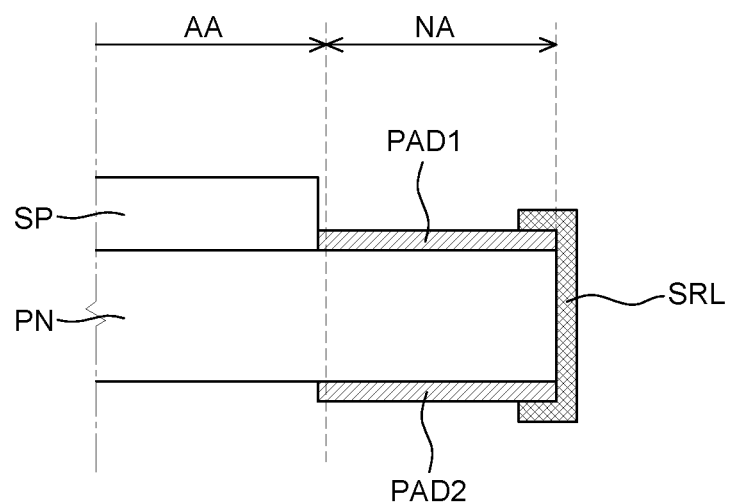
FIG. 2A is a partial cross-sectional view of a display device according to an embodiment of the present disclosure.
Figure 2B:
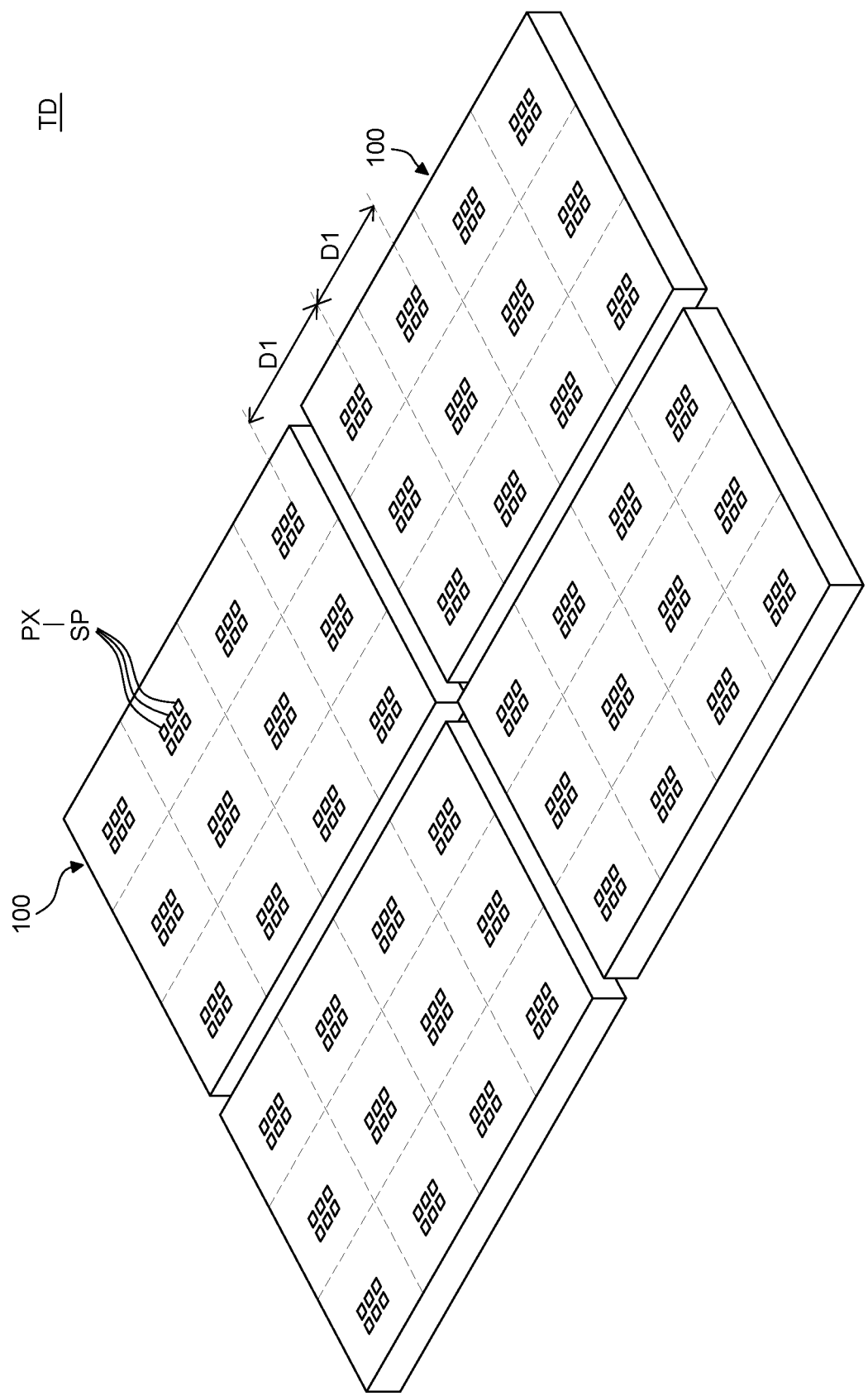
FIG. 2B is a perspective view of a tiling display device according to an embodiment of the present disclosure.

FIG. 2A is a partial cross-sectional view of a display device according to an example embodiment of the present disclosure and FIG. 2B is a perspective view of a tiling display device according to an example embodiment of the present disclosure.

In the non-display area NA of the display panel PN, a plurality of pad electrodes for transmitting various signals to the plurality of sub pixels SP are disposed. For example, in the non-display area NA of the front surface of the display panel PN, a first pad electrode PAD1 which transmits a signal to the plurality of sub pixels SP is disposed. In the non-display area NA of the rear surface of the display panel PN, a second pad electrode PAD2 which is electrically connected to a driving component, such as a flexible film and the printed circuit board, is disposed.

In this situation, various signal lines connected to the plurality of sub pixels SP, for example, a scan line SL or a data line DL extends from the display area AA to the non-display area NA to be electrically connected to the first pad electrode PAD1.

The side line SRL is disposed along a side surface of the display panel PN. The side line SRL electrically connects a first pad electrode *PAD*1 on the front surface of the display panel PN and a second pad electrode PAD2 on the rear surface of the display panel PN. Therefore, a signal from a driving component on the rear surface of the display panel PN is transmitted to the plurality of sub pixels SP through the second pad electrode PAD2, the side line SRL, and the first pad electrode PAD1. Accordingly, a signal transmitting path from the front surface of the display panel PN to the side surface and the rear surface is formed to reduce or minimize an area of the non-display area NA of the display panel PN.

Referring to the example of FIG. 2B, a tiling display device TD having a large screen size can be implemented by connecting a plurality of display devices 100 together. As illustrated in FIG. 2A, when the tiling display device TD is implemented using a display device 100 with a reduced or minimized bezel, a seam area between the display devices 100 in which an image is not displayed is reduced or minimized so that a display quality can be improved.

For example, the plurality of sub pixels SP form one pixel PX (e.g., a pixel unit) and a distance D1 between an outermost pixel PX of one display device 100 and an outermost pixel PX of another display device 100 adjacent to one display device can be implemented to be equal to a distance D1 between pixels PX in one display device 100. Accordingly, a constant distance between pixels PX between the display devices 100 is configured to reduce or minimize a seam area.

However, FIGS. 2A and 2B are illustrative so that the display device 100 according to the example embodiment of the present disclosure can also be a general display device with a bezel, but is not limited thereto.

Figure 3:
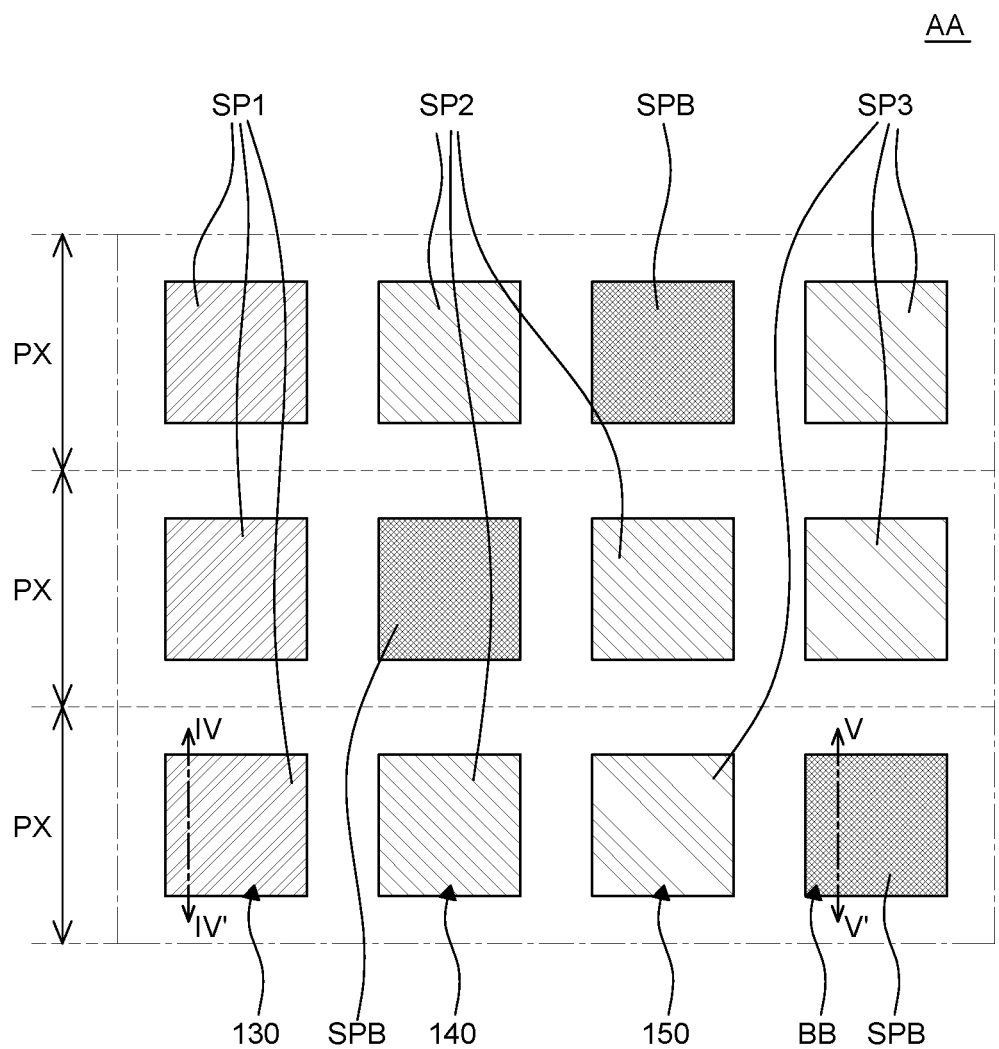
FIG. 3 is an enlarged plan view of a display device according to an embodiment of the present disclosure.
Figure 4:
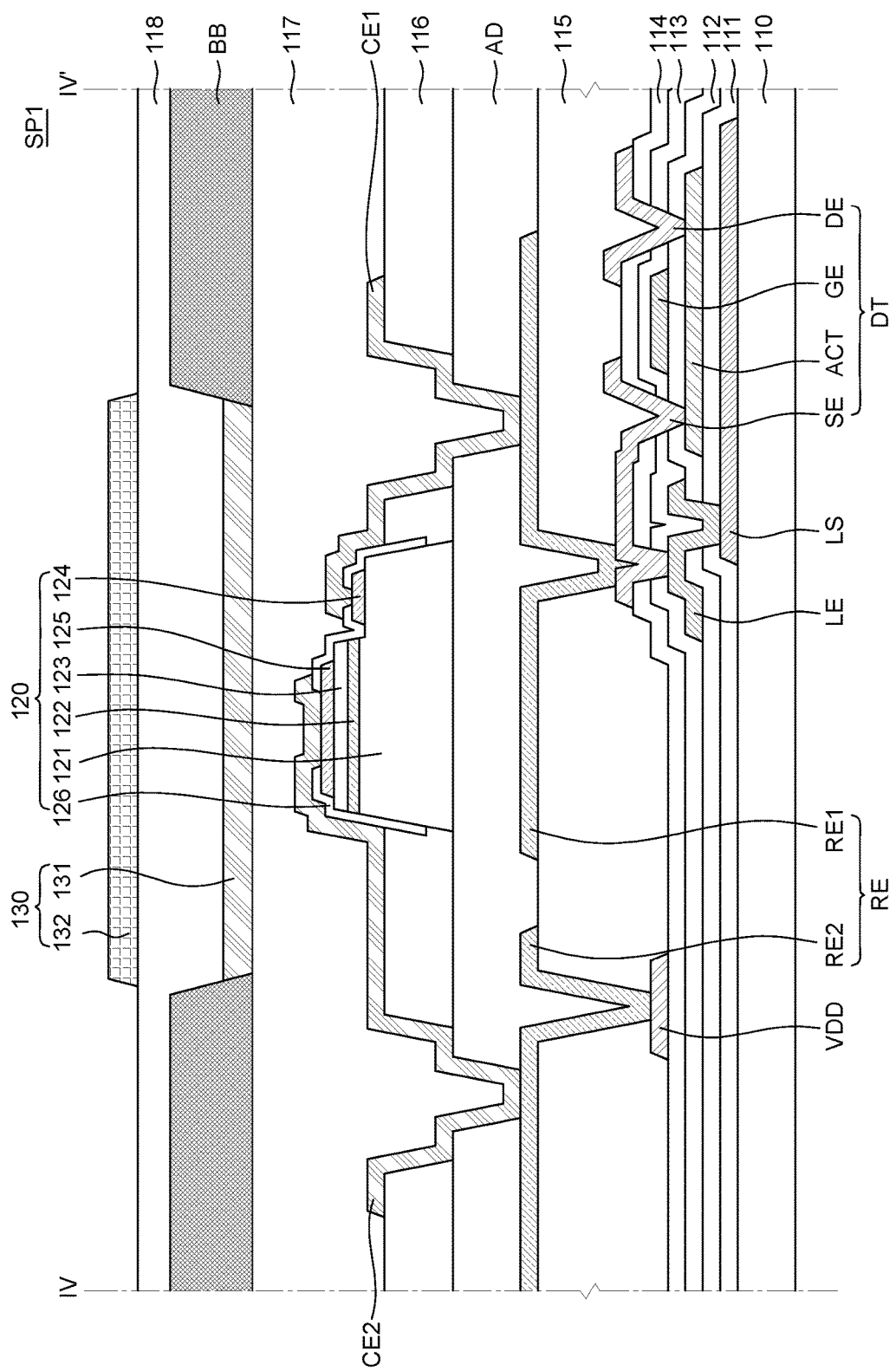
FIG. 4 is a cross-sectional view of a first sub pixel of a display device according to an embodiment of the present disclosure.
Figure 5:
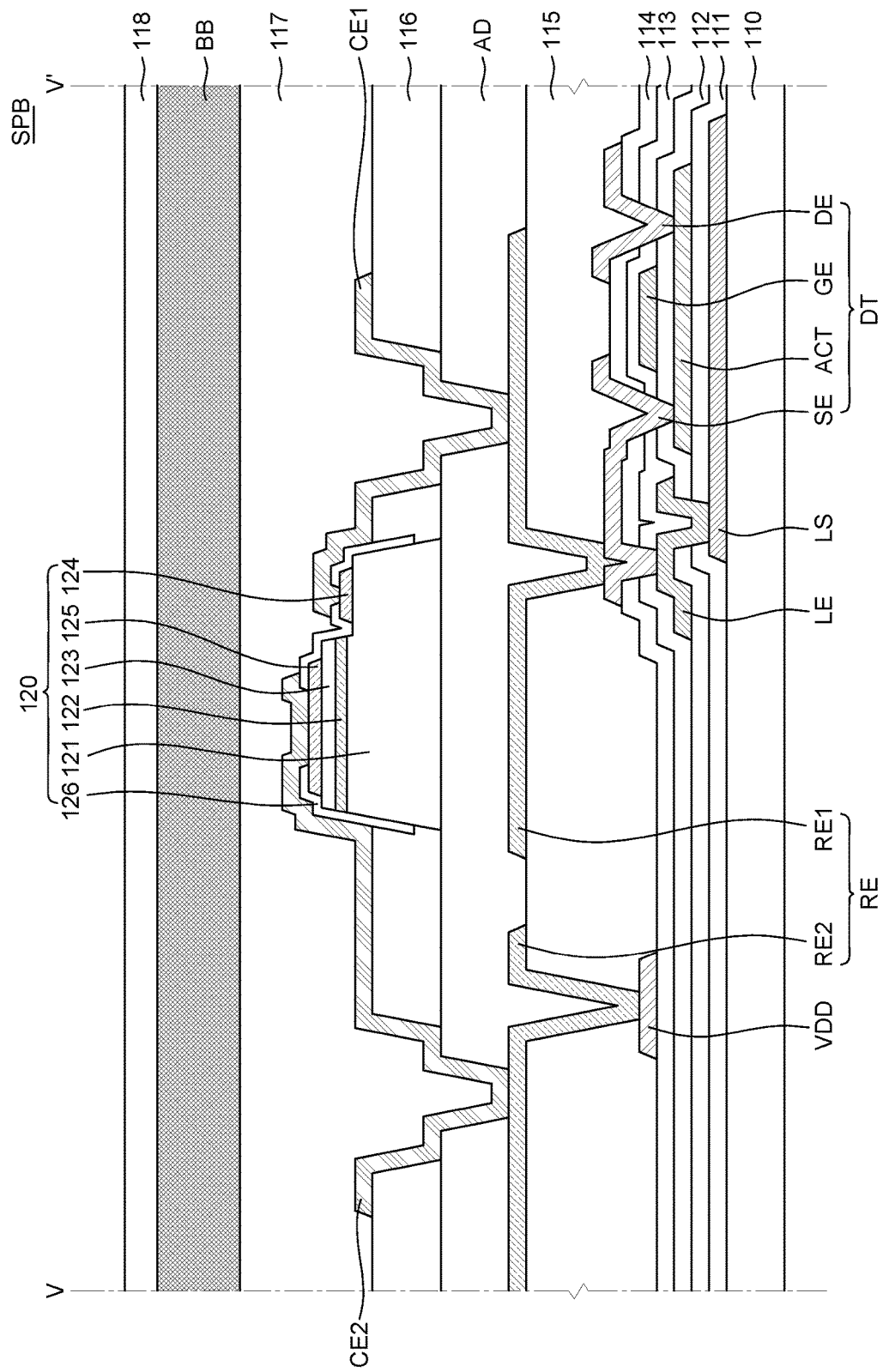
FIG. 5 is a cross-sectional view of a black sub pixel of a display device according to an embodiment of the present disclosure.

FIG. 3 is an enlarged plan view of a display device according to an example embodiment of the present disclosure. FIG. 4 is a cross-sectional view of a first sub pixel of a display device according to an example embodiment of the present disclosure. FIG. 5 is a cross-sectional view of a black sub pixel of a display device according to an example embodiment of the present disclosure. In FIG. 3, for the convenience of description, color conversion members 130, 140, and 150 disposed in each of the plurality of sub pixels SP and only a part of a black matrix BB which overlaps the light emitting diode 120 in the black sub pixel SPB are illustrated.

First, referring to the example of FIG. 3, the display panel PN includes a plurality of pixels PX which are formed by a plurality of sub pixels SP, respectively. Each of the plurality of sub pixels SP includes a light emitting diode 120 and a pixel circuit to independently emit light. For example, one pixel PX can include a first sub pixel SP1, a second sub pixel SP2, a third sub pixel SP3, and a black sub pixel SPB.

Each of the first sub pixel SP1, the second sub pixel SP2, and the third sub pixel SP3 can be any one of a red sub pixel, a green sub pixel, and a blue sub pixel, and the black sub pixel SPB can be a sub pixel SP which does not display light. The black sub pixel SPB is an extra sub pixel SP for repairing a defective sub pixel SP.

For example, a placement order of the first sub pixel SP1, the second sub pixel SP2, the third sub pixel SP3, and a black sub pixel SPB in each of the plurality of pixels PX can be configured in various forms. For example, the plurality of sub pixels SP included in the pixel PX can be disposed in the same row. Some pixels PX among the plurality of pixels PX are disposed in the order of the first sub pixel SP1, the second sub pixel SP2, the black sub pixel SPB, and the third sub pixel SP3, and the other some pixels PX can be disposed in the order of the first sub pixel SP1, the black sub pixel SPB, the second sub pixel SP2, and the third sub pixel SP3. Yet the other some pixels PX are disposed in the order of the first sub pixel SP1, the second sub pixel SP2, the third sub pixel SP3, and the black sub pixel SPB, or disposed in the order of the black sub pixel SPB, the first sub pixel SP1, the second sub pixel SP2, and the third sub pixel SP3. Accordingly, the plurality of sub pixels SP which forms each of the plurality of pixels PX can form various placements. For example, the different color sub pixels within the pixels PX can have different arrangements.

In addition, the placement of the plurality of sub pixels SP can vary depending on the position of the defective sub pixel SP, which will be described in more detail below.

Referring to the example of FIG. 4, in each of the plurality of first sub pixels SP1, second sub pixels SP2, and the third sub pixels SP3 of the display panel PN of the display device 100 according to the example embodiment of the present disclosure, a substrate 110, a buffer layer 111, a gate insulating layer 112, a first interlayer insulating layer 113, a second interlayer insulating layer 114, a first planarization layer 115, an adhesive layer AD, a second planarization layer 116, a third planarization layer 117, a protection layer 118, a black matrix BB, a plurality of color conversion members 130, 140, and 150, a driving transistor DT, a power line VDD, a light emitting diode 120, a plurality of reflective electrodes RE, a plurality of first connection electrodes CE1, a plurality of second connection electrodes CE2, a light shielding layer LS, and an auxiliary electrode LE are disposed. However, the structure and/or arrangement of the subpixels of the display device of the present disclosure is not limited thereto. For example, some of the above elements in the subpixels can be omitted or replaced with other elements.

First, the substrate 110 is a component for supporting various components included in the display device 100 and can be formed of an insulating material. For example, the substrate 110 can be formed of glass or resin. Further, the substrate 110 can be configured to include polymer or plastic, or can be formed of a material having flexibility.

The light shielding layer LS is disposed in each of the plurality of sub pixels SP on the substrate 110. The light shielding layer LS blocks light incident onto an active layer ACT of the driving transistor DT to be described below, below the substrate 110. Light which is incident onto the active layer ACT of the driving transistor DT is blocked by the light shielding layer LS to reduce or minimize a leakage current. For example, the active layer ACT can be protected from light from both sides by the light shielding layer LS and a gate electrode GE.

The buffer layer 111 is disposed on the substrate 110 and the light shielding layer LS. The buffer layer 111 can reduce permeation of moisture or impurities through the substrate 110. The buffer layer 111 can be configured by a single layer or a double layer of silicon oxide (SiOx) or silicon nitride (SiNx), but is not limited thereto. However, the buffer layer 111 can be omitted depending on a type of substrate 110 or a type of transistor, but is not limited thereto.

The driving transistor DT is disposed on the buffer layer 111. The driving transistor DT includes an active layer ACT, a gate electrode GE, a source electrode SE, and a drain electrode DE.

The active layer ACT is disposed on the buffer layer 111. The active layer ACT can be formed of a semiconductor material, such as an oxide semiconductor, amorphous silicon, or polysilicon, but is not limited thereto.

The gate insulating layer 112 is disposed on the active layer ACT. The gate insulating layer 112 is an insulating layer which insulates the active layer ACT from the gate electrode GE and can be configured by a single layer or a double layer of silicon oxide (SiOx) or silicon nitride (SiNx), but is not limited thereto.

The gate electrode GE is disposed on the gate insulating layer 112. The gate electrode GE can be configured by a conductive material, such as copper (Cu), aluminum (Al), molybdenum (Mo), nickel (Ni), titanium (Ti), and chrome (Cr), or an alloy thereof, but is not limited thereto.

The first interlayer insulating layer 113 and the second interlayer insulating layer 114 are disposed on the gate electrode GE. In the first interlayer insulating layer 113 and the second interlayer insulating layer 114, a contact hole through which the source electrode SE and the drain electrode DE are to be connected to the active layer ACT is formed. The first interlayer insulating layer 113 and the second interlayer insulating layer 114 are insulating layers for protecting a component below the first interlayer insulating layer 113 and the second interlayer insulating layer 114, and can be configured by a single layer or a double layer of silicon oxide SiOx or silicon nitride SiNx, but are not limited thereto.

The source electrode SE and the drain electrode DE which are electrically connected to the active layer ACT are disposed on the second interlayer insulating layer 114. The source electrode SE and the drain electrode DE can be configured by a conductive material, such as copper (Cu), aluminum (Al), molybdenum (Mo), nickel (Ni), titanium (Ti), and chrome (Cr), or an alloy thereof, but are not limited thereto.

In addition, in the present disclosure, it is described that the first interlayer insulating layer 113 and the second interlayer insulating layer 114, that is, a plurality of insulating layers is disposed between the gate electrode GE and the source electrode SE and the drain electrode DE. However, only one insulating layer can be disposed between the gate electrode GE and the source electrode SE and the drain electrode DE, but is not limited thereto.

As illustrated in the drawings, when a plurality of insulating layers, such as the first interlayer insulating layer 113 and the second interlayer insulating layer 114, are disposed between the gate electrode GE and the source electrode SE and the drain electrode DE, an electrode can be further formed between the first interlayer insulating layer 113 and the second interlayer insulating layer 114. The additionally formed electrode can form a capacitor with the other configuration disposed below the first interlayer insulating layer 113 or above the second interlayer insulating layer 114.

An auxiliary electrode LE is disposed on the gate insulating layer 112. The auxiliary electrode LE is an electrode which electrically connects the light shielding layer LS below the buffer layer 111 to any one of the source electrode SE and the drain electrode DE on the second interlayer insulating layer 114. For example, the light shielding layer LS is electrically connected to any one of the source electrode SE or the drain electrode DE through the auxiliary electrode LE so as not to operate as a floating gate. Therefore, fluctuation of a threshold voltage of the driving transistor DT caused by a floated light shielding layer LS can be reduced or minimized. Even though in the drawing, the light shielding layer LS is connected to the source electrode SE, the light shielding layer LS can also be connected to the drain electrode DE, but is not limited thereto.

The power line VDD is disposed on the second interlayer insulting layer 114. The power line VDD is electrically connected to the light emitting diode 120 together with the driving transistor DT to allow the light emitting diode 120 to emit light. The power line VDD can be configured by a conductive material such as copper (Cu), aluminum (Al), molybdenum (Mo), nickel (Ni), titanium (Ti), and chrome (Cr), or an alloy thereof, but is not limited thereto.

The first planarization layer 115 is disposed on the driving transistor DT and the power line VDD. The first planarization layer 115 can planarize an upper portion of the substrate 110 on which the driving transistor DT is disposed. The first planarization layer 115 can be configured by a single layer or a double layer, and for example, can be formed of an acrylic organic material, but is not limited thereto.

A plurality of reflective electrodes RE are disposed on the first planarization layer 115 and spaced apart from each other. The plurality of reflective electrodes RE electrically connects the light emitting diode 120 to the power line VDD and the driving transistor DT, and can serve as a reflector which reflects light emitted from the light emitting diode 120 to the upper portion of the light emitting diode 120, at the same time. The plurality of reflective electrodes RE are formed of a conductive material having excellent reflecting property to reflect light emitted from the light emitting diode 120 toward the upper portion of the light emitting diode 120.

The plurality of reflective electrodes RE include a first reflective electrode RE1 and a second reflective electrode RE2. The first reflective electrode RE1 can electrically connect the driving transistor DT and the light emitting diode 120. The first reflective electrode RE1 can be connected to the source electrode SE or the drain electrode DE of the driving transistor DT through a contact hole formed in the first planarization layer 115. The first reflective electrode RE1 can be electrically connected to the first electrode 124 and the first semiconductor layer 121 of the light emitting diode 120 through a first connection electrode CE1 to be described below.

The second reflective electrode RE2 can electrically connect the power line VDD and the light emitting diode 120. The second reflective electrode RE2 is connected to the power line VDD through a contact hole formed in the first planarization layer 115, and can be electrically connected to a second electrode 125 and a second semiconductor layer 123 of the light emitting diode 120 through a second connection electrode CE2 to be described below.

The adhesive layer AD is disposed on the plurality of reflective electrodes RE. The adhesive layer AD is coated on the front surface of the substrate 110 to fix the light emitting diode 120 disposed on the adhesive layer AD. The adhesive layer AD can be selected from any one of adhesive polymer, epoxy resist, UV resin, polyimide, acrylate, urethane, and polydimethylsiloxane (PDMS), but is not limited thereto.

The plurality of light emitting diodes 120 are disposed in each of the plurality of sub pixels SP on the adhesive layer AD. Each of the plurality of light emitting diodes 120 is an element which emits light by a current, and can include a light emitting diode 120 which emits red light, green light, and blue light, and implement various colored light including white light by a combination thereof. For example, the plurality of light emitting diodes 120 can be a light emitting diode (LED) or a micro LED, but is not limited thereto.

The light emitting diode 120 includes a first semiconductor layer 121, a light emitting layer 122, a second semiconductor layer 123, a first electrode 124, a second electrode 125, and an encapsulation layer 126.

The first semiconductor layer 121 is disposed on the adhesive layer AD, and the second semiconductor layer 123 is disposed on the first semiconductor layer 121. The first semiconductor layer 121 and the second semiconductor layer 123 can be formed by doping n-type and p-type impurities into a specific material. For example, each of the first semiconductor layer 121 and the second semiconductor layer 123 can be layers doped with n-type and p-type impurities into a material such as gallium nitride (GaN), indium aluminum phosphide (InAlP), or gallium arsenide (GaAs). The p-type impurity can be magnesium (Mg), zinc (Zn), and beryllium (Be), and the n-type impurity can be silicon (Si), germanium (Ge), and tin (Sn), but are not limited thereto.

The light emitting layer 122 is disposed between the first semiconductor layer 121 and the second semiconductor layer 123. The light emitting layer 122 is supplied with holes and electrons from the first semiconductor layer 121 and the second semiconductor layer 123 to emit light. The light emitting layer 122 can be formed by a single layer or a multi-quantum well (MQW) structure, and for example, can be formed of indium gallium nitride (InGaN) or gallium nitride (GaN), but is not limited thereto.

The first electrode 124 is disposed on the first semiconductor layer 121. The first electrode 124 is an electrode which is to electrically connect the driving transistor DT and the first semiconductor layer 121. The first electrode 124 can be disposed on an upper surface of the first semiconductor layer 121 which is exposed from the light emitting layer 122 and the second semiconductor layer 123. The first electrode 124 can be configured by a conductive material, such as a transparent conductive material such as indium tin oxide (ITO) and indium zinc oxide (IZO) or an opaque conductive material, such as titanium (Ti), gold (Au), silver (Ag), and copper (Cu), or an alloy thereof, but is not limited thereto.

The second electrode 125 is disposed on the second semiconductor layer 123. The second electrode 125 can be disposed on the upper surface of the second semiconductor layer 123. The second electrode 125 is an electrode which is to electrically connect the power line VDD and the second semiconductor layer 123. The second electrode 125 can be configured by a conductive material, such as a transparent conductive material, such as indium tin oxide (ITO) and indium zinc oxide (IZO), or an opaque conductive material, such as titanium (Ti), gold (Au), silver (Ag), and copper (Cu), or an alloy thereof, but is not limited thereto.

Next, the encapsulation layer 126 is disposed, which encloses or surrounds the first semiconductor layer 121, the light emitting layer 122, the second semiconductor layer 123, the first electrode 124, and the second electrode 125. The encapsulation layer 126 is formed of an insulating material to protect the first semiconductor layer 121, the light emitting layer 122, and the second semiconductor layer 123. In the encapsulation layer 126, a contact hole which exposes the first electrode 124 and the second electrode 125 is formed to electrically connect the first connection electrode CE1 and the second connection electrode CE2 to the first electrode 124 and the second electrode 125.

In addition, a part of the side surface of the first semiconductor layer 121 can be exposed from the encapsulation layer 126. The light emitting diode 120 manufactured on the wafer is separated from the wafer to be transferred onto the display panel PN. However, during the process of separating the light emitting diode 120 from the wafer, a part of the encapsulation layer 126 can be torn. For example, a part of the encapsulation layer 126 which is adjacent to a lower edge of the first semiconductor layer 121 of the light emitting diode 120 is torn or breaks off during the process of separating the light emitting diode 120 from the wafer. Accordingly, a lower portion of the side surface of the first semiconductor layer 121 can be exposed to the outside. However, even though the lower portion of the light emitting diode 120 is exposed from the encapsulation layer 126, the first connection electrode CE1 and the second connection electrode CE2 are formed after forming the second planarization layer 116 which covers the side surface of the first semiconductor layer 121. Accordingly, a short defect can be reduced.

The second planarization layer 116 is disposed on the adhesive layer AD and the light emitting diode 120. The second planarization layer 116 overlaps some portions of side surfaces of the plurality of light emitting diodes 120 to fix and protect the plurality of light emitting diodes 120. The second planarization layer 116 can be configured by a single layer or a double layer, and for example, can be formed of a photoresist or an acrylic organic material, but is not limited thereto.

The first connection electrode CE1 and the second connection electrode CE2 are disposed on the second planarization layer 116 and the light emitting diode 120.

The first connection electrode CE1 is an electrode for electrically connecting the light emitting diode 120 and the driving transistor DT. The first connection electrode CE1 can be connected to the first reflective electrode RE1 through the contact hole formed in the second planarization layer 116 and the adhesive layer AD. Accordingly, the first connection electrode CE1 can be electrically connected to any one of the source electrode SE and the drain electrode DE of the driving transistor DT through the first reflective electrode RE1. The first connection electrode CE1 can be connected to the first electrode 124 of the light emitting diode 120 while covering the light emitting diode 120. Accordingly, the first connection electrode CE1 can electrically connect the driving transistor DT to the first electrode 124 and the first semiconductor layer 121 of the plurality of light emitting diodes 120.

The second connection electrode CE2 is an electrode for electrically connecting the light emitting diode 120 and the power line VDD. The second connection electrode CE2 can be connected to the second reflective electrode RE2 through the contact hole formed in the second planarization layer 116 and the adhesive layer AD. Accordingly, the second connection electrode CE2 can be electrically connected to the power line VDD through the second reflective electrode RE2. The second connection electrode CE2 can be connected to the second electrode 125 of the light emitting diode 120 while covering the light emitting diode 120. Accordingly, the second connection electrode CE2 can electrically connect the power line VDD to the second electrode 125 and the second semiconductor layer 123 of the plurality of light emitting diodes 120.

The third planarization layer 117 is disposed on the first connection electrode CE1, the second connection electrode CE2, and the light emitting diode 120. The third planarization layer 117 can cover the light emitting diode 120 to protect the light emitting diode 120. The third planarization layer 117 can be configured by a single layer or a double layer or triple layer, and for example, can be formed of a photoresist or an acrylic organic material, but is not limited thereto. Even though in the specification, it is described that the second planarization layer 116 and the third planarization layer 117 are disposed, the planarization layer can be also formed by a single layer, but is not limited thereto.

The black matrix BB is disposed on the third planarization layer 117. The black matrix BB is disposed in a region between the plurality of sub pixels SP. An opening can be formed in a portion of the black matrix BB overlapping the light emitting diode 120 of each of the plurality of sub pixels SP. The black matrix BB can be formed of an opaque material to reduce color mixture between the plurality of sub pixels SP and for example, can be formed of black resin, but is not limited thereto.

A protection layer 118 is disposed on the black matrix BB. The protection layer 118 is a layer for protecting components below the protection layer 118, and can be configured by a single layer or a double layer of translucent epoxy, silicon oxide (SiOx) or silicon nitride (SiNx), but is not limited thereto.

The color conversion members 130, 140, and 150, which overlap the opening of the black matrix BB, are disposed on the third planarization layer 117. The color conversion members 130, 140, and 150 can convert light emitted from the light emitting diode 120 into various colored light. Each of the plurality of color conversion members 130, 140, and 150 has a size larger than the light emitting diode 120 to have a part overlapping with the light emitting diode 120 and a part which protrudes to the outside of the light emitting diode 120 that does not overlap with the light emitting diode 120. The plurality of color conversion members 130, 140, and 150 include a first color conversion member 130, a second color conversion member 140, and a third color conversion member 150.

Hereinafter, for the convenience of description, it is assumed that the light emitting diode 120 is a blue light emitting diode 120, and the first color conversion member 130, the second color conversion member 140, and the third color conversion member 150 are red, green, and blue color conversion members, respectively. However, it is not limited thereto.

The first color conversion member 130 is disposed in the first sub pixel SP1 to convert blue light emitted from the light emitting diode 120 into red light. The second color conversion member 140 is disposed in the second sub pixel SP2 to convert blue light emitted from the light emitting diode 120 into green light. The third color conversion member 150 is disposed in the third sub pixel SP3 to transmit blue light emitted from the light emitting diode 120 as it is, or convert blue light emitted from the light emitting diode 120 into blue light with a high purity.

Each of the plurality of color conversion members 130, 140, and 150 includes a color conversion layer and a color filter disposed on the color conversion layer. For example, the first color conversion member 130 includes a first color conversion layer 131 and a first color filter 132, and similarly, the second color conversion member 140 includes a second color conversion layer and a second color filter, and the third color conversion member 150 includes a third color conversion layer and a third color filter.

The plurality of color conversion layers can be disposed in or on the opening of the black matrix BB between the third planarization layer 117 and the protection layer 118. The plurality of color conversion layers can include a color conversion material, such as a quantum dot, a nano fluorescent material, or an organic fluorescent material. The color conversion material included in the plurality of color conversion layers absorbs light emitted from the light emitting diode 120 to emit light having a different wavelength.

For example, the first color conversion layer 131 includes a color conversion material which absorbs blue light to emit red light, and the second color conversion layer can include a color conversion material which absorbs blue light to emit green light. Since the light emitted from the light emitting diode 120 is blue light, the third color conversion layer can be formed of only a transparent material, but can further include a separate color conversion material to improve the color purity.

A plurality of color filters are disposed on the protection layer 118 to overlap with the plurality of color conversion layers, respectively. The plurality of color filters are disposed to correspond to the openings in the black matrix BB. The plurality of color filters can improve a color purity of light displayed in the sub pixel SP. The plurality of color filters transmit only light having a specific wavelength and absorb light having the other wavelengths to improve the color purity of the light emitted from each sub pixel SP. However, embodiments of the present disclosure are not limited thereto. For example, the plurality of color filters can be disposed within the protection layer 118. As another example, both the color conversion layers and the color filters can be disposed on the protection layer 118.

For example, the first color filter 132 disposed in the first sub pixel SP1 absorbs some blue light which is not converted in the first color conversion layer 131, and can transmit only red light which is converted in the first color conversion layer 131 (e.g., the first color filter 132 can act as a backup layer to block any left over blue light that was not adequately converted in to red light by the first color conversion layer 131). Similarly, the second color filter disposed in the second sub pixel SP2 absorbs some remaining blue light which was not converted by the second color conversion layer, and can transmit only green light which is converted by the second color conversion layer. The third color filter disposed in the third sub pixel SP3 can transmit only blue light and blocks other colors.

Referring to the example of FIG. 5, the plurality of black sub pixels SPB of the display device 100 according to the example embodiment of the present disclosure has substantially the same structure as the plurality of first sub pixels SP1, the plurality of second sub pixels SP2, and the plurality of third sub pixels SP3 except that the opening is not formed in the black matrix BB and the color conversion members 130, 140, and 150 are not disposed. Rather, the black matrix BB extends across the black sub pixel SPB and covers the light emitting diode 120.

Specifically, the black matrix BB is disposed to cover the entire black sub pixel SPB. The black matrix BB does not include a separate opening in the black sub pixel SPB so that even though light is emitted from the light emitting diode 120 of the black sub pixel SPB, the light traveling to the outside of the display device 100 can be blocked. That is, in the black sub pixel SPB, a black matrix BB which is a shielding layer which blocks the light can be formed instead of the color conversion members 130, 140, and 150. For example, a part of the black matrix BB overlapping with the light emitting diode in the black sub pixel SPB can also be referred to as a light shielding pattern. However, within the black sub pixel SPB, an opening can also be formed in the black matrix BB, and a separate light shielding pattern can be disposed within such opening to block light. In such a situation, the separate light shielding pattern can be formed of a material same as or different from that of the black matrix BB.

In addition, as illustrated in FIG. 5, the black sub pixel SPB can be a sub pixel SP in which the light emitting diode 120 is disposed to emit light, or can be a defective sub pixel SP which does not emit light due to the transferring failure of the light emitting diode 120.

For example, when the remaining first sub pixel SP1, second sub pixel SP2, and third sub pixels SP3 included in one pixel PX are normal and emit light properly, even though the light emitting diode 120 of the black sub pixel SPB also emits light, a black matrix BB which covers the black sub pixel SPB. Accordingly, each of the first sub pixel SP1, the second sub pixel SP2, and the third sub pixel SP3 is included in one pixel PX to normally display various colored light. If separate color conversion members 130, 140, and 150 are disposed on the black sub pixel SPB, color irregularity occurs so that it is difficult to normally display the image. Therefore, when all the remaining sub pixels SP are normal, the black matrix BB is formed on the black sub pixel SPB to normally display the image.

As another example, when the black sub pixel SPB does not emit light due to the transferring failure of the light emitting diode 120, a black matrix BB which covers the black sub pixel SPB can be formed. A black matrix BB which covers the defective sub pixel SP which is not lighted is formed to create the black sub pixel SPB.

As described above, the black sub pixel SPB is an extra sub pixel SP for repairing a defective sub pixel SP. For example, in one pixel PX, a first sub pixel SP1, a second sub pixel SP2, and a third sub pixel SP3 which are a red sub pixel, a green sub pixel, and a blue sub pixel are gathered to display various color images. However, when the light emitting diode 120 is not normally transferred onto any one of the first sub pixel SP1, the second sub pixel SP2, and the third sub pixel SP, a dark pixel defect can occur. For example, the defective sub pixel SP can occur when the light emitting diode 120 is not transferred, or transferred out of a proper position, or not properly aligned, or due to a defect of the light emitting diode 120. Accordingly, in order to repair the defective sub pixel SP, various methods can be used.

For example, three extra light emitting diodes can be used in the situation of compensating for the failure of one of the light emitting diodes which is usually used for the first sub pixel, the second sub pixel, and the third sub pixel and also referred to as the main light emitting diodes. However, an extra light emitting diode is further transferred so that the number of necessary light emitting diodes was doubled so that the manufacturing cost was increased. In other words, each main sub pixel within one pixel unit PX can have its own backup or failover sub pixel, but this is costly and takes up space, and effectively doubles the amount of sub pixels needed in the display device.

Accordingly, a method for forming only a sub pixel which is mainly used, and transferring a flip-chip type light emitting diode onto only a defective sub pixel to repair can also be used. However, a number of light emitting diodes transferred onto one display device can be millions to tens of millions, and a yield of the transferring process is not so high so that at least tens of thousands of defective sub pixels may be generated. Therefore, this process of repairing thousands of defective sub pixels is very difficult, and a process time and a manufacturing cost are increased to reduce a process inefficiency.

Accordingly, in the display device 100 according to the example embodiment of the present disclosure, when a defective sub pixel SP occurs in one of the three sub pixels SP including a first sub pixel SP1, a second sub pixel SP2, and a third sub pixel SP3 which form one pixel PX, an extra sub pixel SP to be used instead is further formed. Further, in consideration of the position of the defective sub pixel SP, a black matrix BB and color conversion members 130, 140, and 150 can be formed. One pixel PX can display various color images with a combination of the first sub pixel SP1, the second sub pixel SP2, and the third sub pixel SP3. Four sub pixels SP are formed in one pixel PX from the beginning (e.g., at the point of manufacture) and a lighting test can be performed after transferring the light emitting diodes 120. At this time, one sub pixel SP among four sub pixels SP may be a defective sub pixel SP, and a black matrix BB which covers the defective sub pixel SP is formed to form a black sub pixel SPB. A plurality of color conversion members 130, 140, and 150 are formed in each of three remaining sub pixels SP to form a first sub pixel SP1, a second sub pixel SP2, and a third sub pixel SP3. When all four sub pixels SP are normal, one sub pixel SP is formed as a black sub pixel SPB so that individual sub pixels SP each emitting red light, green light, and blue light are provided in one pixel PX and the one pixel PX (e.g., which can include the three sub pixels SP) emits the proper amounts of different colored light. In other words, according to the example embodiment of the present disclosure, four sub pixels can always be laid down for each pixel unit PX in the display and all four sub pixels can be tested shortly thereafter before laying down the additional layers that go on top of the light emitting diodes 120 (e.g., the color filters and the protection layer 118, etc.). Further, if one of the light emitting diodes 120 among those four sub pixels is defective based on the test, then the defective sub pixel can be covered over with the black matrix BB. Also, if all four sub pixels do pass the test and operate normally (e.g., all four light emitting diodes 120 were properly transferred and successfully aligned and emit proper light), then one of the four sub pixels can still be covered over with the black matrix BB in order to maintain the proper color balance for the pixel unit PX. Accordingly, in the display device 100 according to the example embodiment of the present disclosure, a repair process of additionally transferring the light emitting diode 120 after the lighting test is eliminated and no longer needed, in order to simplify the process. In order words, the embodied invention can form extra sub pixels, test all the sub pixels, and then effectively "paint over" any sub pixels that are defective or not needed with the black matrix BB. In the display device 100 according to the example embodiment of the present disclosure, unlike the method of additionally forming a redundancy sub pixel SP for every one of the main sub pixels SP (e.g., effectively doubling the number of the light emitting diodes used), only one extra sub pixel SP is formed within a pixel unit PX. By doing this, the number of light emitting diodes 120 which are transferred for the entire display device 100 is reduced and a manufacturing cost can be reduced. Further, the number of light emitting diodes 120 in one pixel PX is reduced so that the area occupied by the light emitting diodes 120 is reduced to improve a degree of freedom of design and speed up of the manufacture process.

Further, in the display device 100 according to the example embodiment of the present disclosure, a single type of light emitting diode 120 is transferred in the plurality of sub pixels SP (e.g., light emitting diodes can be all be of the same type, such as blue light emitting diodes), and the color conversion members 130, 140, and 150 are formed in consideration of the position of the defective sub pixel SP to implement various colored light. For example, the color conversion members 130, 140, and 150 can be formed over only the non-defective light emitting diodes or on only the light emitting diodes that are needed for producing the desired colors from one pixel PX. Accordingly, the yield can be increased while reducing the number of times of the transferring process of trying to insert and align light emitting diodes. For example, when the display device is formed by transferring the red light emitting diode, the green light emitting diode, and the blue light emitting diode, three separate processes of transferring the red light emitting diode, the green light emitting diode, and the blue light emitting diode are necessary, which is costly and time consuming. In contrast, like the display device 100 according to the example embodiment of the present disclosure, only one type of light emitting diode 120 (e.g., a blue light emitting diode) is transferred onto all the plurality of sub pixels SP and then the color conversion members 130, 140, and 150 are formed only in the normal (e.g., non-defective) sub pixels SP. By doing this, all of the necessary colors for the red, green, and blue light can be implemented. Accordingly, since the same type of the light emitting diode 120 used for the transferring process for all the sub pixels, the number of times of having to perform the transferring process is reduced while also increasing the yield.

Hereinafter, a driving method of the display device 100 according to the example embodiment of the present disclosure will be described with reference to FIGS. 6 and 7.

Figure 6:
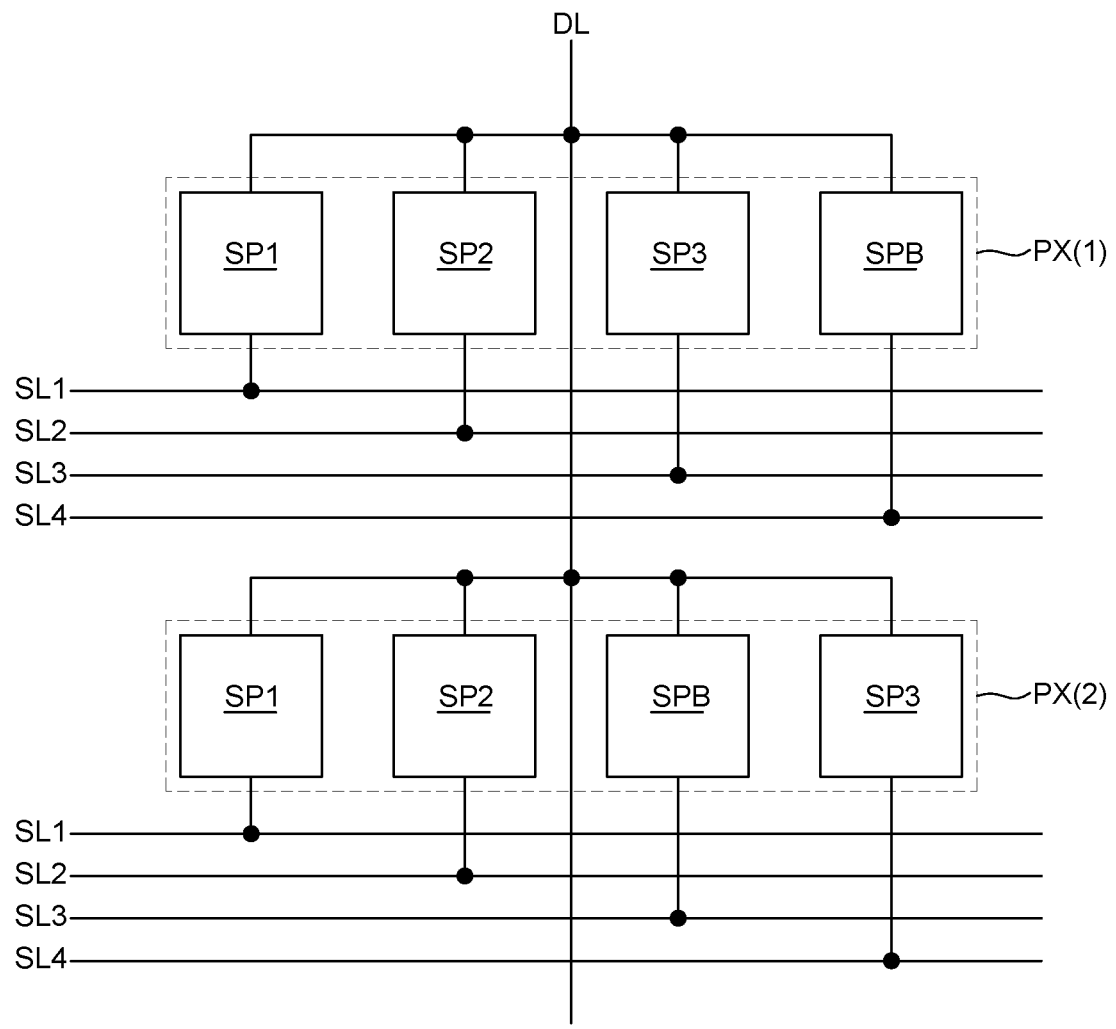
FIG. 6 is a schematic circuit diagram of a plurality of sub pixels of a display device according to an embodiment of the present disclosure.

FIG. 6 is a schematic circuit diagram of a plurality of sub pixels of a display device according to an example embodiment of the present disclosure. FIG. 7 is a driving timing diagram of a plurality of sub pixels of a display device according to an example embodiment of the present disclosure.

Referring to the example of FIG. 6, the plurality of pixels PX are connected to a data line DL and a plurality of scan lines SL to be driven. The plurality of pixels PX are supplied with a data voltage applied from the data line DL in response to the scan signal from the plurality of scan lines SL to be driven.

Hereinafter, for the convenience of description, it is described by assuming that one pair of adjacent pixels PX which share one data line DL is referred to as a first pixel PX(1) and a second pixel PX(2), respectively, but is not limited thereto.

The plurality of sub pixels SP included in one pixel PX is connected to the same data line DL and is connected to different scan lines SL from each other. For example, the plurality of sub pixels SP included in the first pixel PX(1) can be connected to the same data line DL. The plurality of sub pixels SP included in the first pixel PX(1) can be connected to different scan lines SL from each other. Each of the first sub pixel SP1, the second sub pixel SP2, the third sub pixel SP3, and the black sub pixel SPB of the first pixel PX(1) can be connected to a first scan line SL1, a second scan line SL2, a third scan line SL3, and a fourth scan line SL4, respectively.

For example, the plurality of sub pixels SP included in the second pixel PX(2) can be connected to the same data line DL. Each of the first sub pixel SP1, the second sub pixel SP2, the black sub pixel SPB, and the third sub pixel SP3 of the second pixel PX(2) can be connected to a first scan line SL1, a second scan line SL2, a third scan line SL3, and a fourth scan line SL4, respectively.

Figure 7:
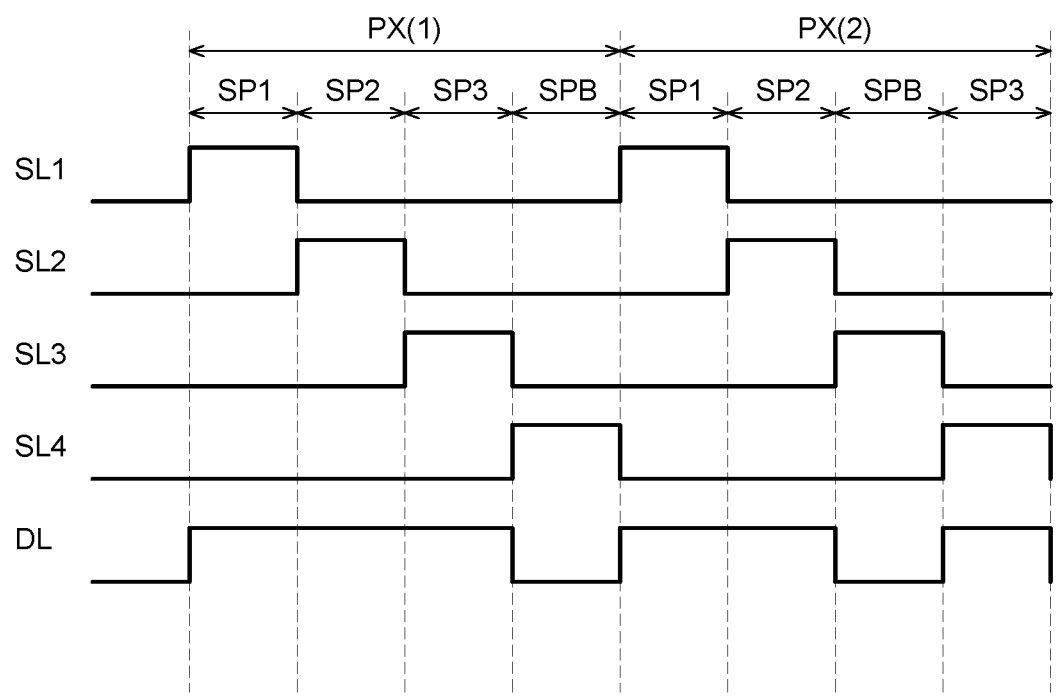
FIG. 7 is a driving timing diagram of a plurality of sub pixels of a display device according to an embodiment of the present disclosure.

Referring to the example of FIG. 7, a data voltage can be input to the first pixel PX(1) first. A turn-on level scan signal is applied to the first scan line SL1 first to apply a data voltage to the first sub pixel SP1 in the first pixel PX(1) connected to the first scan line SL1. Next, a turn-on level scan signal is applied to the second scan line SL2 to apply a data voltage to the second sub pixel SP2 in the first pixel PX(1) connected to the second scan line SL2. Then, a turn-on level scan signal is applied to the third scan line SL3 to apply a data voltage to the third sub pixel SP3 in the first pixel PX(1) connected to the third scan line SL3. Finally, a turn-on level scan signal can be applied to the fourth scan line SL4. However, the black sub pixel SPB within the first pixel PX(1) connected to the fourth scan line SL4 is a sub pixel SP that does not emit light so a data voltage corresponding to a black image can be applied to the black sub pixel SPB.

Next, after the data voltage is sequentially applied to all the plurality of sub pixels SP in the first pixel PX(1), the data voltage can be input to the second pixel PX(2). The turn-on level scan signal is sequentially applied to the first scan line SL1, the second scan line SL2, the third scan line SL3, and the fourth scan line SL4 so that the data voltage can be sequentially applied to each of the first sub pixel SP1, the second sub pixel SP2, the black sub pixel SPB, and the third sub pixel SP3. When a turn-on level scan signal is applied to the third scan line SL3, the sub pixel SP connected to the third scan line SL3 is a black sub pixel SPB and a data voltage corresponding to a black image can be applied to the black sub pixel SPB via the data line DL.

Therefore, the scan signal is sequentially applied to the first sub pixel SP1, the second sub pixel SP2, the third sub pixel SP, and one or more black sub pixel SPB which form one pixel PX, at different timings to input different data voltages to each sub pixel SP. In each of the plurality of pixels PX, the sub pixels SP are disposed in different forms so that an order of applying a scan signal to the first sub pixel SP1, the second sub pixel SP2, the third sub pixel SP3, and the black sub pixel SPB in some pixels PX can be different from an order of applying a scan signal to the first sub pixel SP1, the second sub pixel SP2, the third sub pixel SP3, and the black sub pixel SPB in the other some pixels PX (e.g., depending on which of the four sub pixels within one pixel PX is configured as the black sub pixel SPB).

Accordingly, in the display device 100 according to the example embodiment of the present disclosure, an order of inputting a data voltage can be individually adjusted for each pixel PX in consideration of the position of the black sub pixel SPB. Specifically, the plurality of sub pixels SP which form one pixel PX are connected to the same data line DL, but are connected to different scan lines SL from each other. Accordingly, when the turn-on level scan signal is input to each of the plurality of scan lines SL, the data voltage can be input to only a sub pixel SP connected to each scan line SL. When the scan signal is applied to the scan line SL connected to the black sub pixel SPB, a data voltage of a black image is applied to the data line DL at the same timing. When a scan signal is applied to the scan line SL connected to the remaining first sub pixel SP1, the second sub pixel SP2, and the third sub pixel SP3, a normal data voltage can be applied to the data line DL. Accordingly, a data voltage is applied in accordance with which type of sub pixel SP is connected to the scan line SL to drive the plurality of pixels PX.

Figure 8:
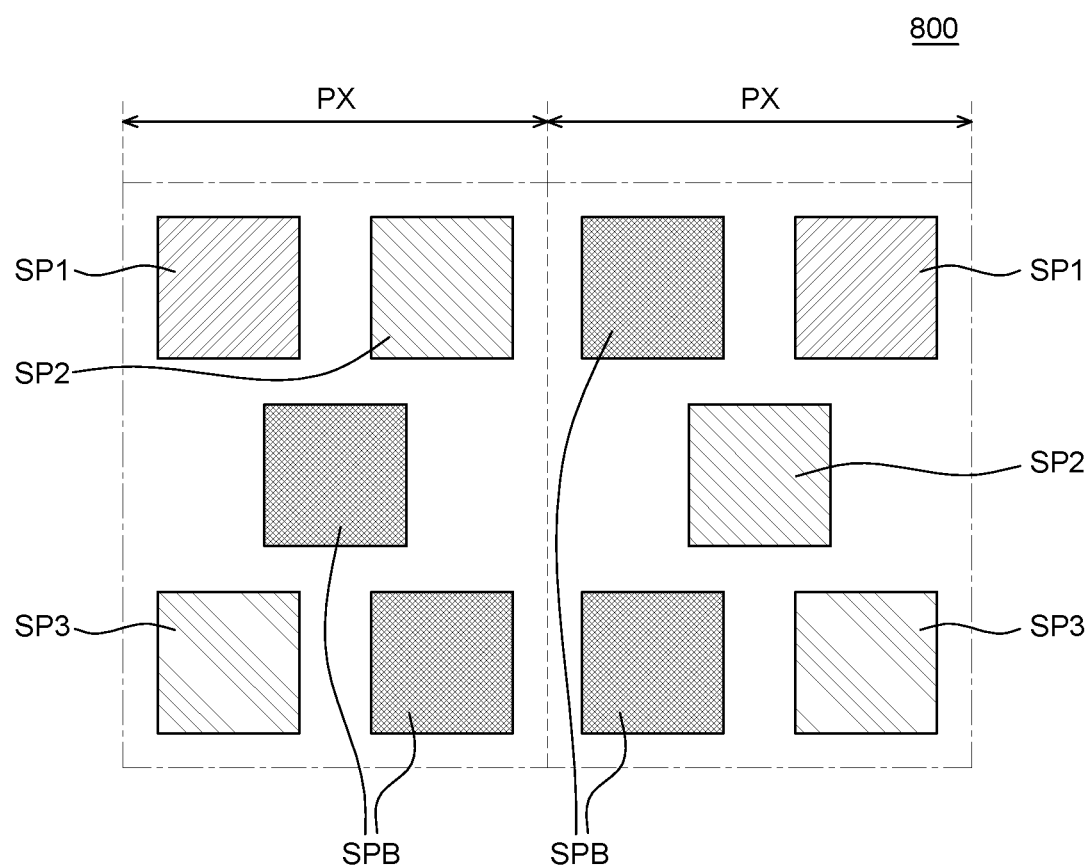
FIG. 8 is an enlarged plan view of a display device according to another embodiment of the present disclosure.
Figure 9:
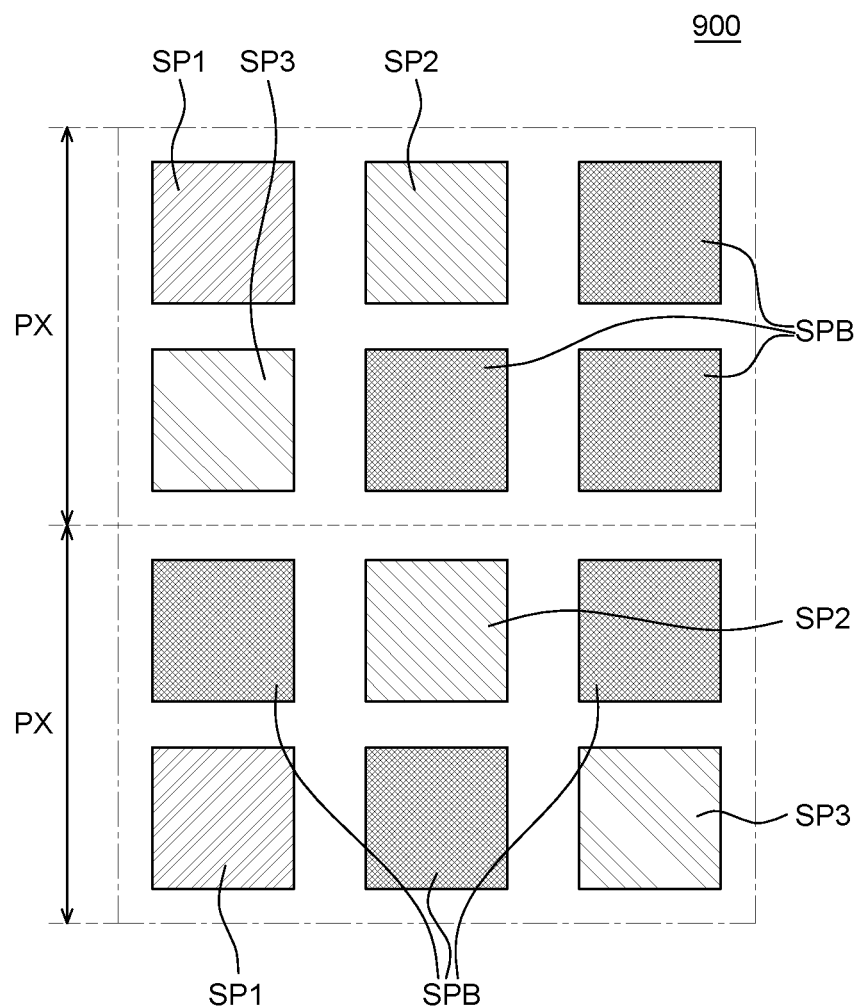
FIG. 9 is an enlarged plan view of a display device according to still another embodiment of the present disclosure.

FIG. 8 is an enlarged plan view of a display device according to another example embodiment of the present disclosure and FIG. 9 is an enlarged plan view of a display device according to still another example embodiment of the present disclosure. A display device 800 of FIG. 8 and a display device 900 of FIG. 9 have the substantially same configuration as the display device 100 of FIGS. 1 to 7 except for the number of the plurality of sub pixels SP included in the pixel PX so that a redundant description will be omitted. For example, rather than having four sub pixels within each pixel PX (e.g., leaving one extra sub pixel available for redundancy), the embodiment of FIG. 8 can have five sub pixels within each pixel PX (e.g., leaving two extra sub pixels available for redundancy for more options when deciding which sub pixels should be turned into black sub pixels), and the embodiment of FIG. 9 can have six sub pixels within each pixel PX (e.g., leaving three extra sub pixels available for even more options when deciding which sub pixels should be turned into black sub pixels).

Referring to the example of FIG. 8, in the display device 800 according to another example embodiment of the present disclosure, each of the plurality of pixels PX can be formed of five sub pixels SP. For example, one pixel PX can include one first sub pixel SP1, one second sub pixel SP2, one third sub pixel SP3, and two black sub pixels SPB. The placement of the sub pixels SP in each pixel PX can be configured in various forms. For example, the placement of the plurality of sub pixels SP in one pixel PX can be different from the arrangement of the plurality of sub pixels SP in another pixel PX, and a position of the black sub pixel SPB can be different from each other.

Referring to the example of FIG. 9, in the display device 900 according to still another example embodiment of the present disclosure, each of the plurality of pixels PX can be formed of six sub pixels SP. For example, one pixel PX can include one first sub pixel SP1, one second sub pixel SP2, one third sub pixel SP3, and three black sub pixels SPB. The placement of the sub pixels SP in each pixel PX can be configured in various forms. For example, the placement of the plurality of sub pixels SP in one pixel PX can be configured to be different from the arrangement of the plurality of sub pixels SP in another pixel PX, and a position of the black sub pixel SPB can be different.

In the display device 800 according to another example embodiment of the present disclosure and the display device 900 according to still another example embodiment of the present disclosure, by considering that a plurality of defective sub pixels SP is generated in one pixel PX, one pixel PX can include one or more extra sub pixels SP in addition to three sub pixels SP. For example, one pixel PX is driven to include one first sub pixel SP1, one second sub pixel SP2, and one third sub pixel SP3, but when placing the light emitting diodes, a transferring failure may occur in two or more sub pixels SP. At this time, the extra sub pixel SP is used as the first sub pixel SP1, the second sub pixel SP2, and the third sub pixel SP3, and the defective sub pixel SP can be formed as a black sub pixel SPB. Accordingly, one pixel PX includes at least one first sub pixel SP1, one second sub pixel SP2, and one third sub pixel SP3 to be normally driven. Further, even when all the plurality of sub pixels SP included in one pixel PX are normal and non-defective, the remaining sub pixels SP excluding one first sub pixel SP1, one second sub pixel SP2, and one third sub pixel SP3 can be formed as black sub pixels SPB to form a normal pixel PX that emits the proper balance of colors, which is formed by one first sub pixel SP1, one second sub pixel SP2, and one third sub pixel SP3.

The example embodiments of the present disclosure can also be described as follows:

According to an aspect of the present disclosure, there is provided a display device. The display device includes a substrate in which a plurality of pixels is defined, a plurality of light emitting diodes disposed in the plurality of pixels, a color conversion member disposed on some light emitting diodes among the plurality of light emitting diodes, and a light shielding pattern which is disposed on the remaining light emitting diode of the plurality of light emitting diodes. Each of the plurality of pixels includes one first sub pixel, one second sub pixel, one third sub pixel, and one or more black sub pixels.

Each of the plurality of light emitting diodes can be disposed in each of the first sub pixel, the second sub pixel, the third sub pixel, and the one or more black sub pixels.

The color conversion member can be disposed in the first sub pixel, the second sub pixel, and the third sub pixel.

The light shielding pattern can be disposed to overlap the plurality of light emitting diodes in the one or more black sub pixels.

The display device can further include a black matrix disposed on the same layer as the light shielding pattern. The black matrix can include an opening overlapping the color conversion member of the first sub pixel, the second sub pixel, and the third sub pixel.

The black matrix can be integrally formed with the light shielding pattern to cover the one or more black sub pixels.

The one or more black sub pixels can be defective sub pixels.

The one or more black sub pixels can be normal sub pixels (e.g., non-defective sub pixel that emit light properly).

Some pixels among the plurality of pixels can have different placements for the first sub pixel, the second sub pixel, the third sub pixel, and the one or more black sub pixels.

The display device can further include a data line connected to the plurality of pixels, and a plurality of scan lines which is connected to the plurality of pixels to apply a scan signal. The first sub pixel, the second sub pixel, the third sub pixel, and the one or more black sub pixels which form one pixel among the plurality of pixels can be connected to the same data line, and can be connected to different scan lines among the plurality of scan lines.

When the scan signal is applied to the scan line connected to the one or more black sub pixels among the plurality of scan lines, a data voltage corresponding to a black image can be applied to the data line at the same time.

The scan signal can be applied, at different timings from each other, to the first sub pixel, the second sub pixel, the third sub pixel, and the one or more black sub pixels which form one pixel.

An order of applying the scan signal to each of the first sub pixel, the second sub pixel, the third sub pixel, and the one or more black sub pixels of some pixels can be different from an order of applying the scan signal to each of the first sub pixel, the second sub pixel, the third sub pixel, and the one or more black sub pixel in other pixels.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the appended claims, and all the technical concepts in the equivalent scope thereof should be construed as falling within the scope of the present disclosure.

What is claimed is:

1. A display device, comprising:
    a substrate including a plurality of pixels;
    a plurality of light emitting diodes disposed in each of the plurality of pixels;
    a color conversion member disposed over at least two light emitting diodes among the plurality of light emitting diodes in one pixel among the plurality of pixels; and
    a light shielding pattern disposed over at least one light emitting diode among the plurality of light emitting diodes in the one pixel for forming a black sub pixel that does not emit light outside of the display device,
    wherein each of the plurality of pixels includes a first sub pixel, a second sub pixel, a third sub pixel, and one or more black sub pixels.

2. The display device according to claim 1, wherein the plurality of light emitting diodes all include same type of light emitting diode.

3. The display device according to claim 1, wherein each of the plurality of light emitting diodes is a blue light emitting diode.

4. The display device according to claim 1, wherein one of the plurality of light emitting diodes is disposed in each of the first sub pixel, the second sub pixel, the third sub pixel, and the one or more black sub pixels.

5. The display device according to claim 4, wherein the color conversion member is disposed in each of the first sub pixel, the second sub pixel, and the third sub pixel.

6. The display device according to claim 5, wherein the light shielding pattern is disposed to overlap with one or more light emitting diodes in the one or more black sub pixels.

7. The display device according to claim 6, further comprising:
    a black matrix disposed over the same layer as the light shielding pattern,
    wherein the black matrix includes an opening overlapping with the color conversion member of the first sub pixel, the second sub pixel, and the third sub pixel.

8. The display device according to claim 7, wherein the black matrix is integrally formed with the light shielding pattern to cover the one or more black sub pixels.

9. The display device according to claim 7, wherein the one or more black sub pixels include one or more defective light emitting diodes.

10. The display device according to claim 7, wherein the one or more black sub pixels are one or more non-defective light emitting diodes configured to emit light.

11. The display device according to claim 4, wherein the color conversion member includes:
    a first color conversion member disposed in the first sub pixel to convert a light emitted from the corresponding light emitting diode into red light;
    a second color conversion member disposed in the second sub pixel to convert a light emitted from the corresponding light emitting diode into green light; and
    a third color conversion member disposed in the third sub pixel to convert a light emitted from the corresponding light emitting diode into blue light.

12. The display device according to claim 6, wherein some pixels among the plurality of pixels have a different arrangement of the first sub pixel, the second sub pixel, the third sub pixel, and the one or more black sub pixels from other pixels among the plurality of pixels.

13. The display device according to claim 1, further comprising:
    a data line connected to the plurality of pixels; and
    a plurality of scan lines connected to the plurality of pixels to apply a scan signal,
    wherein the first sub pixel, the second sub pixel, the third sub pixel, and the one or more black sub pixels which form one pixel among the plurality of pixels are connected to a same data line, and are connected to different scan lines among the plurality of scan lines.

14. The display device according to claim 13, wherein when the scan signal is applied to one or more scan lines connected to the one or more black sub pixels among the plurality of scan lines, a data voltage corresponding to a black image is applied to the data line.

15. The display device according to claim 13, wherein the scan signal is applied at different timings to the first sub pixel, the second sub pixel, the third sub pixel, and the one or more black sub pixels which form the one pixel.

16. The display device according to claim 15, wherein an order of applying the scan signal to each of the first sub pixel, the second sub pixel, the third sub pixel, and the one or more black sub pixels of some pixels among the plurality of pixels is different from an order of applying the scan signal to each of the first sub pixel, the second sub pixel, the third sub pixel, and the one or more black sub pixel in other pixels among the plurality of pixels.

17. The display device according to claim 13, wherein the substrate includes a display area and a non-display area adjacent to the display area, the display device further comprises:
a gate driver mounted in the display area in a gate in active area manner;
a side line disposed along a side surface of the substrate to electrically connect a first pad electrode on a front surface of the substrate to a second pad electrode on a rear surface of the substrate.

18. The display device according to claim 17, further comprising a data driver and a timing controller disposed over the rear surface of the substrate.

19. The display device according to claim 1, further comprising:
a light shielding layer disposed under an active layer of a driving transistor connected to one of the plurality of light emitting diodes.

20. The display device according to claim 19, wherein the light shielding layer is electrically connected to a source electrode or a drain electrode of the driving transistor.

21. A method of manufacturing a display device, the method comprising:
disposing first, second, third and fourth driving transistors on a substrate;
disposing an intermediary layer on the first, second, third and fourth driving transistors;
disposing first, second, third and fourth light emitting diodes on the intermediary layer, the first, second, third and fourth light emitting diodes being connected to the first, second, third and fourth driving transistors, respectively;
testing the first, second, third and fourth light emitting diodes to determine whether any defective light emitting diode exists among the first, second, third and fourth light emitting diodes;
disposing first, second and third color conversion members over non-defective light emitting diodes among the first, second, third and fourth light emitting diodes, respectively; and
disposing a black matrix to completely cover a remaining light emitting diode among the first, second, third and fourth light emitting diodes that does not include the non-defective light emitting diodes.

22. The method of claim 21, wherein the remaining light emitting diode is non-defective and is configured to emit light, and
wherein the black matrix is configured to block the light emitted from the remaining light emitting diode.

23. The method of claim 21, wherein the remaining light emitting diode is defective and cannot emit light.

* * * * *